(12) United States Patent
Batra et al.

(10) Patent No.: US 8,780,615 B2
(45) Date of Patent: *Jul. 15, 2014

(54) MEMORY DEVICE AND METHOD OF WRITING DATA TO A MEMORY DEVICE

(75) Inventors: Naveen Batra, Greater Noida (IN); Rajiv Kumar, Greater Noida (IN); Saurabh Agrawal, Raipur (IN)

(73) Assignee: STMicroelectronics International N.V., Amsterdam (NL)

( * ) Notice: Subject to any disclaimer, the term of this patent is extended or adjusted under 35 U.S.C. 154(b) by 153 days.

This patent is subject to a terminal disclaimer.

(21) Appl. No.: 13/422,906

(22) Filed: Mar. 16, 2012

(65) Prior Publication Data
US 2012/0224440 A1 Sep. 6, 2012

Related U.S. Application Data

(63) Continuation of application No. 12/762,607, filed on Apr. 19, 2010, now Pat. No. 8,154,911.

(30) Foreign Application Priority Data

Dec. 21, 2009 (IN) .............................. 2676/Del/2009

(51) Int. Cl.
*G11C 11/00* (2006.01)
(52) U.S. Cl.
USPC ...................... 365/154; 365/156; 365/230.05

(58) Field of Classification Search
USPC ..................................... 365/154, 156, 230.05
See application file for complete search history.

(56) References Cited

U.S. PATENT DOCUMENTS

| 5,784,320 | A | | 7/1998 | Johnson |
|---|---|---|---|---|
| 5,973,984 | A | * | 10/1999 | Nagaoka ................... 365/230.03 |
| 6,934,213 | B2 | | 8/2005 | Becker |
| 6,944,076 | B2 | * | 9/2005 | Nakamura et al. ............ 365/203 |
| 7,170,805 | B2 | * | 1/2007 | Song ............................. 365/203 |
| 7,218,562 | B2 | * | 5/2007 | Campbell ..................... 365/203 |
| 7,729,190 | B2 | * | 6/2010 | Xi ................................. 365/226 |
| 8,009,500 | B2 | * | 8/2011 | Nii et al. ....................... 365/226 |
| 8,116,152 | B2 | * | 2/2012 | Kaku et al. ............... 365/189.16 |
| 8,154,911 | B2 | * | 4/2012 | Batra et al. .................... 365/154 |
| 2007/0139997 | A1 | | 6/2007 | Suzuki et al. |

* cited by examiner

*Primary Examiner* — Pho M Luu
(74) *Attorney, Agent, or Firm* — Hogan Lovells US LLP

(57) ABSTRACT

In a memory device, a bitline write voltage is applied to a first bitline. A wordline voltage is applied to a first wordline for writing data to a first memory cell connected to the first wordline and the first bitline. The first bitline and the second bitline are electrically connected for charge sharing between the first bitline and the second bitline. A predetermined time after electrically connecting the first bitline and the second bitline, the first and the second bitline are electrically disconnected and the bitline write voltage is applied to the second bitline. The wordline voltage is applied to a second wordline for writing data to a second memory cell connected to the second wordline and the second bitline.

28 Claims, 4 Drawing Sheets

MEMORY DEVICE AND METHOD OF WRITING DATA TO A MEMORY DEVICE

RELATED APPLICATION

The present invention is a continuation of U.S. patent application Ser. No. 12/762,607 filed Apr. 19, 2010, now U.S. Pat. No. 8,154,911 which claims the benefit of Indian Patent Application No. 2676/Del/2009 filed Dec. 21, 2009, both of which are incorporated herein by reference in their entireties.

BACKGROUND OF THE INVENTION

1. Field of the Invention

The present invention relates to memory devices such as dynamic random access memory (DRAM) and static random access memory (SRAM) devices and to an associated power-saving writing method.

2. Description of the Related Art

Due to high demands of portable devices, power consumption has become a major concern in chip design, especially in embedded memories like dynamic random access memory (DRAM) and static random access memory (SRAM). Memory can cover around 70% to 90% of the total chip area of a device and, hence, can contribute significantly to the power consumption of the chip or chips of the device.

A high power consumption of a chip can have severe impacts on the routing lines of a chip. Due to the ohmic resistance of the routing lines, heat can be created, which may entail a necessity to provide a heat sink for removing heat. Moreover, a high power consumption of a chip can entail a relatively large electrical current density in the routing lines, which may increase the likelihood of electromigration effects and other degradation processes occurring. Such degradation processes can reduce the lifetime and robustness of a chip. Moreover, a high power consumption of a chip can reduce the lifetime of a battery supplying electric power to a device. Furthermore, a high power consumption of chips can increase the likelihood of electromagnetic interference (EMI) occurring, which can adversely affect the security of devices such as smart cards.

There are techniques for improving the performance of memory devices, which include the use of dual wordline architecture, and the use of bank type architecture. Dual wordline architecture allows reducing bitline precharge power, while entailing a relatively low area penalty. The dual wordline technique can reduce the bitline precharge power by half, thus saving about 25 to 30% of the memory cut power. Bank type architecture has less impact on power consumption, but can increase operating speed, while having a high area impact. Bank type architecture has been found to be less preferable for low area and low power applications such as smart cards and automotive electronics.

U.S. Pat. No. 5,784,320 discloses a write control unit, coupled to a memory cell, for controlling write operations to the memory cell. The write control unit includes a write qualification unit that qualifies the write operation. The write qualification unit includes a first input for receiving a first data signal that includes a current data value of the memory cell. The write qualification unit also includes a second input for receiving a second data signal that indicates a data value to be written to the memory cell. The write qualification unit enables a write operation to the memory cell only if the first data signal is different from the second data signal (i.e., the current data value and the data value to be written are different). If the first data value and the second data value are the same, the write qualification unit suppresses the write operation.

Since write operations are performed only if the data to be written into the memory cell differs from the current data value of the memory cell, the write control unit of U.S. Pat. No. 5,784,320 allows to reduce the write power, in particular if the memory device is operated at a relatively high voltage where a full voltage swing of bitlines performed for writing data to the memory cell requires more power than reading data from the memory cell. However, the write control unit of U.S. Pat. No. 5,784,320 is less efficient if the memory device is operated at low voltage, as can be done in current memory devices specifically designed for low power operation. Moreover, the write circuit of U.S. Pat. No. 5,784,320 requires extra circuit area, and the time required for writing data to the memory device can be almost doubled, since a read operation requiring extra time is performed before data is written to the memory device.

U.S. Pat. No. 6,934,213 discloses a method and a circuit for reducing power consumption during write operations in a RAM. In a RAM comprised of a plurality of memory cells, the bit lines that are coupled to each memory cell in the RAM and used to read and write data into the cell are coupled through charge share control circuitry to a charge sharing line. During write operations, the bit line that will receive a zero value is coupled to the charge share line before data is written to the cell. The charge share line equalizes the charge on the selected bit line and the charge share line and reduces the voltage differential that must be swung to write data into the cell.

While the method and device of U.S. Pat. No. 6,934,213 can allow a reduction of the power required by the RAM, noise margin failures may occur. Moreover, about one quarter of the charge of the bitline will return to the bitline again, and the charge sharing mechanism of U.S. Pat. No. 6,934,213 allows only charge sharing within one column of the RAM.

It is an object of the present subject matter to provide a method of writing data to a memory device and a memory device which allow substantially avoiding or at least reducing the above-mentioned problems of the state of the art.

SUMMARY OF THE DISCLOSURE

Herein, a method of writing data to a memory device is disclosed. The memory device comprises a plurality of bitlines, a plurality of wordlines, and a matrix of memory cells. The matrix of memory cells comprises a plurality of memory cells arranged in a plurality of rows and columns. Each of the bitlines is electrically connected to memory cells in one of the columns. Each of the wordlines is electrically connected to memory cells in one of the rows. The method comprises applying a bitline write voltage to a first bitline. A wordline voltage is applied to a first wordline for writing data to a first memory cell connected to the first wordline and the first bitline. The first bitline and the second bitline are electrically connected for charge sharing between the first bitline and the second bitline. A predetermined time after electrically connecting the first bitline and the second bitline, the first and the second bitline are electrically disconnected and the bitline write voltage is applied to the second bitline. The wordline voltage is applied to a second wordline for writing data to a second memory cell connected to the second wordline and the second bitline.

A memory device is also disclosed herein. The memory device comprises a plurality of wordlines, a plurality of bitlines and a matrix of memory cells. The matrix of memory cells comprises a plurality of memory cells arranged in a plurality of rows and columns. Each of the bitlines is electrically connected to memory cells in one of the columns. Each of the wordlines is electrically connected to memory cells in one of the rows. The memory device further comprises a bitline connection line, and each of the columns comprises a bitline charge control circuit and a precharge circuit. The precharge circuit is adapted for applying a precharge voltage to one of the bitlines associated with the column upon receipt of a precharge signal from the bitline charge control circuit. The bitline charge control circuit is adapted for electrically connecting the one of the bitlines associated with the respective column to the bitline connection line upon receipt of a bitline write signal, for maintaining the electrical connection between the one of the bitlines and the bitline connection line when the bitline write signal is not received any more, and for electrically disconnecting the one of the bitlines and the bitline connection line and supplying the precharge signal to the precharge circuit when a charge recycling end signal is received and the column write signal is not received. The memory device further comprises a driver circuit for applying the bitline write signal to one of the bitline charge control circuits connected to one of the bitlines connected to the memory cell to be written and, a predetermined time after applying the bitline write signal to the one of the bitline charge control circuits, applying the charge recycling end signal to each of the bitline charge control circuits, applying a bitline write voltage to the bitline connection line, and applying a wordline voltage to a wordline associated with a row of the matrix of memory cells wherein the memory cell to be written is located and subsequently ceasing to apply the column write signal.

A further memory device described herein comprises a plurality of bitlines, a plurality of wordlines and a matrix of memory cells. The matrix of memory cells comprises a plurality of memory cells arranged in a plurality of rows and columns. Each of the bitlines is electrically connected to memory cells in one of the columns. Each of the wordlines is electrically connected to memory cells in one of the rows. The memory device further comprises circuitry for performing the steps of applying a bitline write voltage to a first bitline, applying a wordline voltage to a first wordline for writing data to a first memory cell connected to the first wordline and the first bitline, electrically connecting the first bitline and the second bitline for charge sharing between the first bitline and the second bitline, electrically disconnecting the first bitline and the second bitline and applying the bitline write voltage to the second bitline a predetermined time after electrically connecting the first bitline and the second bitline, and for applying the wordline voltage to a second wordline for writing data to a second memory cell connected to the second wordline and the second bitline.

BRIEF DESCRIPTION OF THE DRAWINGS

Embodiments of the present invention will now be described with reference to the drawings, wherein.

DETAILED DESCRIPTION OF PREFERRED EMBODIMENTS

In the following, embodiments of a method of writing data to a memory device and a memory device are disclosed, wherein the charge of a first bitline that has been used for writing data to a first memory cell is partially transferred to a second bitline that is used for writing data to a second memory cell in a subsequent memory access cycle. In some embodiments, this charge sharing between bitlines used in consecutive write cycles can reduce the core power consumption of the memory device by about 30 to 35%, allowing a reduction of the cut power consumption by about 10% to about 15%.

In some embodiments, a wordline voltage can be applied to the wordlines of the memory device not until after the charge sharing between the first and the second bitline. Thus, the pulse width of the wordline voltage can be reduced, which can allow to reduce the power consumed for precharging bitlines of columns of the array of memory cells which are not written in the current memory access cycle, by about 20 to 30%, which can again be about 10% to about to 15% of the cut power of the memory device. Thus, the total power consumption can be reduced by about 25% to about 30%, with an area penalty of about 2% to about 5% and about 5 to 10% penalty in memory access time and memory cycle time.

Moreover, in embodiments of the method and memory device of the present disclosure, a precharging of bitlines can be avoided, if data bits having the same value are written into memory cells connected to the same bitline(s). For example, if about half of the of the data bits that are written into the memory device have the same value, and are written into memory cells connected to the same bitline(s), then a reduction of the memory cut power of about 30% to about 40%, being even greater than the above-described values, can be obtained.

Figure 1:
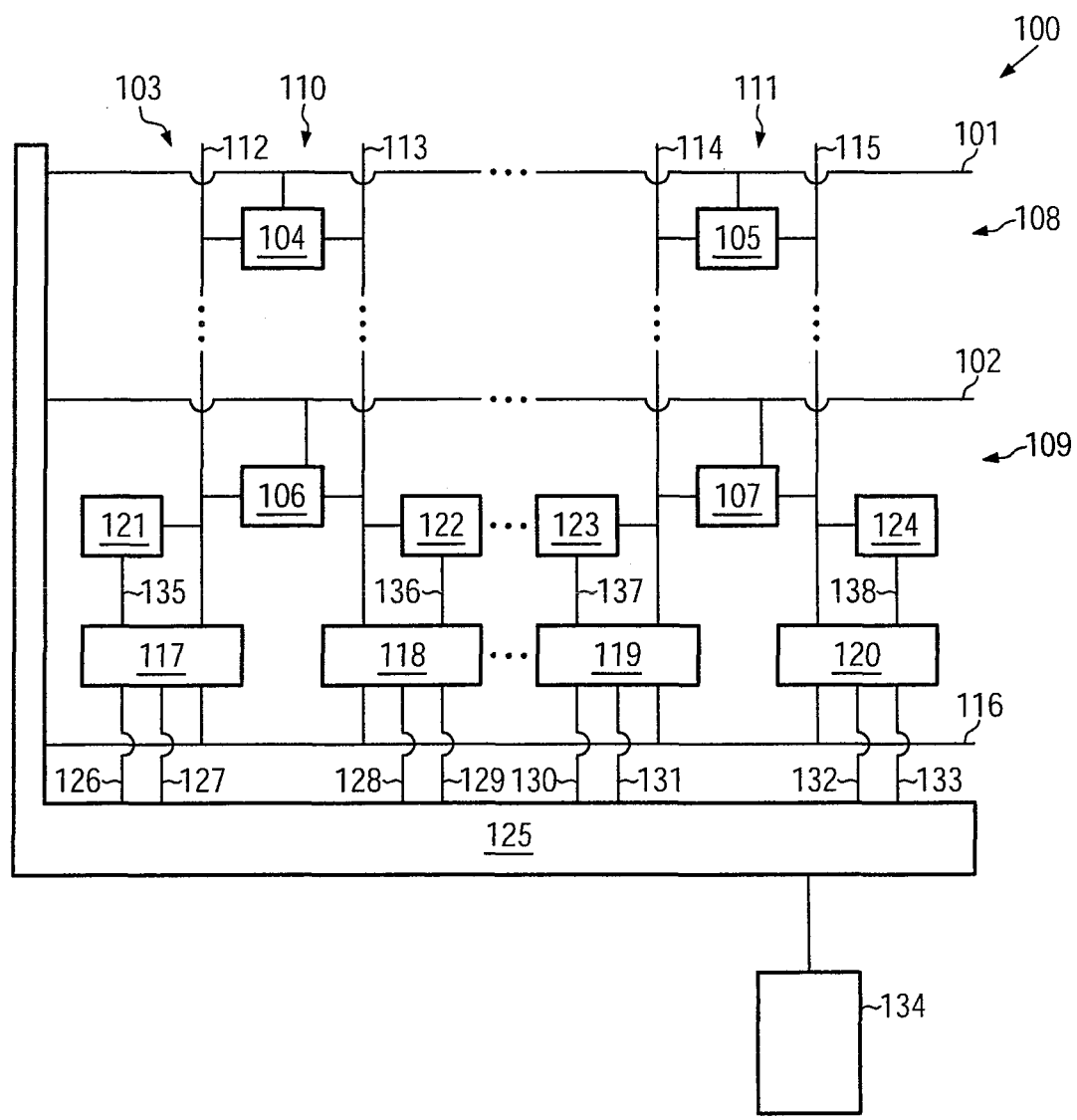
FIG. 1 shows a schematic block diagram of a memory device according to an embodiment.

FIG. 1 shows a schematic block diagram of a memory device 100 according to an embodiment. The memory device 100 comprises a plurality of bitlines 112-115, a plurality of wordlines 101, 102 and a matrix 103 of memory cells. The matrix 103 comprises a plurality of memory cells 104-107 that are arranged in a plurality of rows 108, 109 and columns 110, 111. Dots in FIG. 1 schematically indicate that additional rows can be provided between rows 101, 102 and columns 110, 111, and additional columns can be provided between columns 110, 111. The configuration of the additional rows and columns can correspond to the configuration of rows 108, 109 and columns 110, 111.

Each of the bitlines 112-115 is connected to memory cells in one of the columns 110, 111 of the matrix 103 of memory cells. The memory cells 104-107 can be static memory cells, each memory cell being connected to two of the bitlines 112-115. Bitlines 112, 113 are connected to memory cells 104, 106 in column 110, and bitlines 114, 115 are connected to memory cells 105, 107 in column 111.

In other embodiments, each of the memory cells 104-107 can be connected to only one bitline. In some of these embodiments, the memory cells 104-107 can be dynamic memory cells. In such embodiments, each of the columns 110, 111 can comprise a single bitline, each of the memory cells being connected to the bitline associated with the column of the matrix 103 wherein the respective memory cell is located.

Each of the wordlines 101, 102 is connected to memory cells in one of the rows 108, 109 of the matrix 103. For example, wordline 101 is connected to memory cells 104, 105 in row 108, and wordline 102 is connected to memory cells 106, 107 in row 109.

Each of the memory cells 104-107 can comprise circuitry corresponding to that of known static or dynamic memory cells. An example of the structure of the memory cells 104-107 in an embodiment wherein the memory cells 104-107 are static memory cells will be described in more detail below.

The memory device 100 further comprises a bitline connection line 116. The bitline connection line 116 can be an electrically conductive line having a known structure of an electrically conductive line in a semiconductor chip, similar to that of wordlines 101, 102 and bitlines 112-115.

The memory device 100 further comprises a plurality of bitline charge control circuits 117-120. Each of the bitline charge control circuits 117-120 is associated with one of the bitlines 112-115. In particular, bitline charge control circuit 117 is associated with bitline 112, bitline charge control circuit 118 is associated with bitline 113, bitline charge control circuit 119 is associated with bitline 114, and bitline charge control circuit 120 is associated with bitline 115. Hence, in the embodiment of FIG. 1, each of the columns 110, 111 comprises two bitline charge control circuits associated with the two bitlines of the respective column 110, 111.

In other embodiments wherein each of the columns 110, 111 comprises a single bitline, for example in embodiments wherein the memory cells 104-107 are dynamic memory cells, each of the columns 110, 111 can comprise a single bitline charge control circuit.

Each of the bitline charge control circuits 117-120 comprises a first input (denoted by reference numerals 126, 129, 130, 133 in FIG. 1) and a second input (denoted by reference numerals 127, 128, 131, 132 in FIG. 1). Each of the first inputs 126, 129, 130, 133 is adapted for receiving, from a driver circuit 125, a bitline write signal, and each of the second inputs 127, 128, 131, 132 is adapted for receiving a charge recycling end signal from the driver circuit 125.

The memory device 100 further comprises a plurality of precharge circuits 121-124. Each of the precharge circuits 121-124 is associated with one of the bitlines 112-115. For example, precharge control circuit 121 is associated with bitline 112, precharge control circuit 122 is associated with bitline 113, precharge control circuit 123 is associated with bitline 114, and precharge control circuit 124 is associated with bitline 115. Hence, in the embodiment of FIG. 1, each of the columns 110, 111 of the matrix 103 comprises two precharge control circuits.

In other embodiments, wherein each of the columns 110, 111 comprises a single bitline, for example in embodiments wherein the memory cells 104-107 are dynamic memory cells as described above, each of the columns 110, 111 can comprise a single precharge circuit.

Each of the precharge circuits 121-124 comprises an input (denoted by reference numerals 135-138 in FIG. 1) for receiving a precharge signal from one of the bitline charge control circuits 117-120 associated with the same bitline as the respective precharge circuit. Upon receipt of the precharge signal via input 135, the precharge circuit 121 applies a precharge voltage to the bitline 112. Similarly, each of the precharge circuits 122-124 applies the precharge voltage to a respective one of the bitlines 113-115 upon receipt of the precharge signal at its input. In the absence of the precharge signals, each of the precharge circuits 121-124 can disconnect the respective bitline from the precharge voltage.

Upon receipt of the bitline write signal from the driver circuit 125, the bitline charge control circuit 117 provides an electrical connection between the bitline 112 and the bitline connection line 116, and does not apply the precharge signal to the precharge circuit 121. The bitline charge control circuit 117 maintains the electrical connection between the bitline 112 and the bitline connection line 116, even in the absence of the bitline write signal, until the charge recycling end signal is received via the second input 127.

If the charge recycling end signal is received, and the bitline write signal is not received any more at the first input 126, the bitline charge control circuit 117 electrically disconnects the bitline 112 from the bitline connection line 116, and applies the precharge signal to the precharge circuit 121, such that the precharge circuit 121 connects the bitline 112 to the precharge voltage.

If the bitline write signal is still applied at the first input 126 when the charge recycling end signal is received at the second input 127 of the bitline charge control circuit 117, the bitline charge control circuit 117 maintains the electrical connection between the bitline 112 and the bitline connection line 116, and does not apply the precharge signal to the precharge circuit 121.

The functionality of the precharge control circuits 118-120 corresponds to the above-described functionality of the precharge control circuit 117.

If data is to be written into one of the memory cells 104-107, the driver circuit 125 applies the bitline write signal to the bitline charge control circuit connected to one of the bitlines connected to the respective memory cell. For example, if data is to be written into one of the memory cells 104, 106 in column 110, the bitline write signal is applied to bitline charge control circuit 117 or to bitline charge control circuit 118, depending on whether a logic zero or a logic one is to be written. If data is to be written into one of the memory cells 105, 107 in column 111, the bitline write signal is applied to bitline charge control circuit 119 or to bitline charge control circuit 120, depending on whether a logic one or a logic zero is to be written.

The driver circuit 134 can receive a clock signal from a clock circuit 134.

In the following, a case wherein data is to written into memory cell 104, and wherein the bitline write signal is applied to bitline charge control circuit 117 will be described, as an example of writing data to a first memory cell (memory cell 104) connected to a first wordline (wordline 101) and a first bitline (bitline 112).

Upon receipt of the clock signal from clock circuit 134, the driver circuit 125 applies the bitline write signal to bitline charge control circuit 117. The other bitline charge control circuits 118-120 do not receive the bitline write signal. The bitline charge control circuit 117 then provides an electrical connection between the bitline 112 and the bitline connection line 116. At this point of time, the bitline charge control circuit does not apply the precharge signal to precharge circuit 121, such that the bitline 112 is disconnected from the precharge voltage. At this point of time, the bitline charge control line 116 can be electrically floating, such that a charge equilibration can take place between the bitline 112 and other elements connected to the bitline connection line 116, for example another bitline, as will be explained in more detail below.

A predetermined time after applying the bitline write signal to the bitline charge control circuit 117, the control circuit applies the charge recycling end signal to each of the bitline charge control circuits 117-120. Thereafter, each of the bitline charge control circuits 118-120 which does not receive the bitline write signal, disconnects its respective bitline from the bitline connection line 116, and supplies the precharge signal to its respective precharge circuit, and the precharge circuits 122, 123, 124 apply the precharge voltage to the bitlines 113, 114, 115, as described above. Thus, each of the bitlines 113, 114, 115 is charged to the precharge voltage.

Since the bitline charge control circuit 117 still receives the bitline write signal from the control circuit 125, the bitline charge control circuit 117 maintains the electrical connection between the bitline 112 and the bitline connection line 116.

Substantially simultaneously with applying the charge recycling end signal to the bitline charge control circuits 117-120, the driver circuit 125 can apply a bitline write voltage to the bitline connection line 116. Thus, the bitline 112 electrically connected to the bitline connection line 116 by the bitline charge control circuit 117 is charged to the bitline write voltage. Additionally, the driver circuit 125 applies a wordline voltage to the wordline 101 connected to the first memory cell.

In some embodiments, the bitline write voltage can be substantially zero (ground) voltage, and the precharge voltage and the wordline voltage can be a positive voltage Vdd. Those wordlines which are not connected to the memory cell 104 can also be held at substantially zero voltage.

The memory cell 104, with the bitline write voltage applied via bitline 112, the precharge voltage applied via bitline 113 and the wordline voltage applied via wordline 101 turns into a state wherein the data bit to be written into the memory cell 104 is stored in the memory cell 104. Thus, the writing of data to the memory cell 104 is completed.

After writing data to the memory cell 104, the driver circuit 125 stops applying the bitline write signal to the bitline charge control circuit 117, applying the wordline voltage to the wordline 101 and applying the charge recycling end signal to the bitline charge control circuits 117-120. Moreover, the driver circuit 125 disconnects the bitline connection line 116 from the bitline write voltage.

Since the charge recycling end signal is not applied to the bitline charge control circuit 117 any more, the bitline control circuit 117 continues to provide an electrical connection between the bitline 112 and the bitline connection line 116, even in the absence of the bitline write signal at its first input 126.

After writing data to a first memory cell, such as, for example, the memory cell 114, data can be written to a second memory cell of the matrix 103 of memory cells. The second memory cell can be in the same column of the matrix 103 as the first memory cell, or in a different column of the matrix 103.

In the following, as an example of writing data to a second memory cell in the same column of the matrix 103, writing data to the memory cell 106 will be described, wherein the data bit to be written into the memory cell 106 is inverse to the data bit previously written into the memory cell 104, as described above. Hence, in writing the data bit to the memory cell 106, the driver circuit 125 applies the bitline write signal to the bitline charge control circuit 118 electrically connected to the bitline 113.

Figure 2:
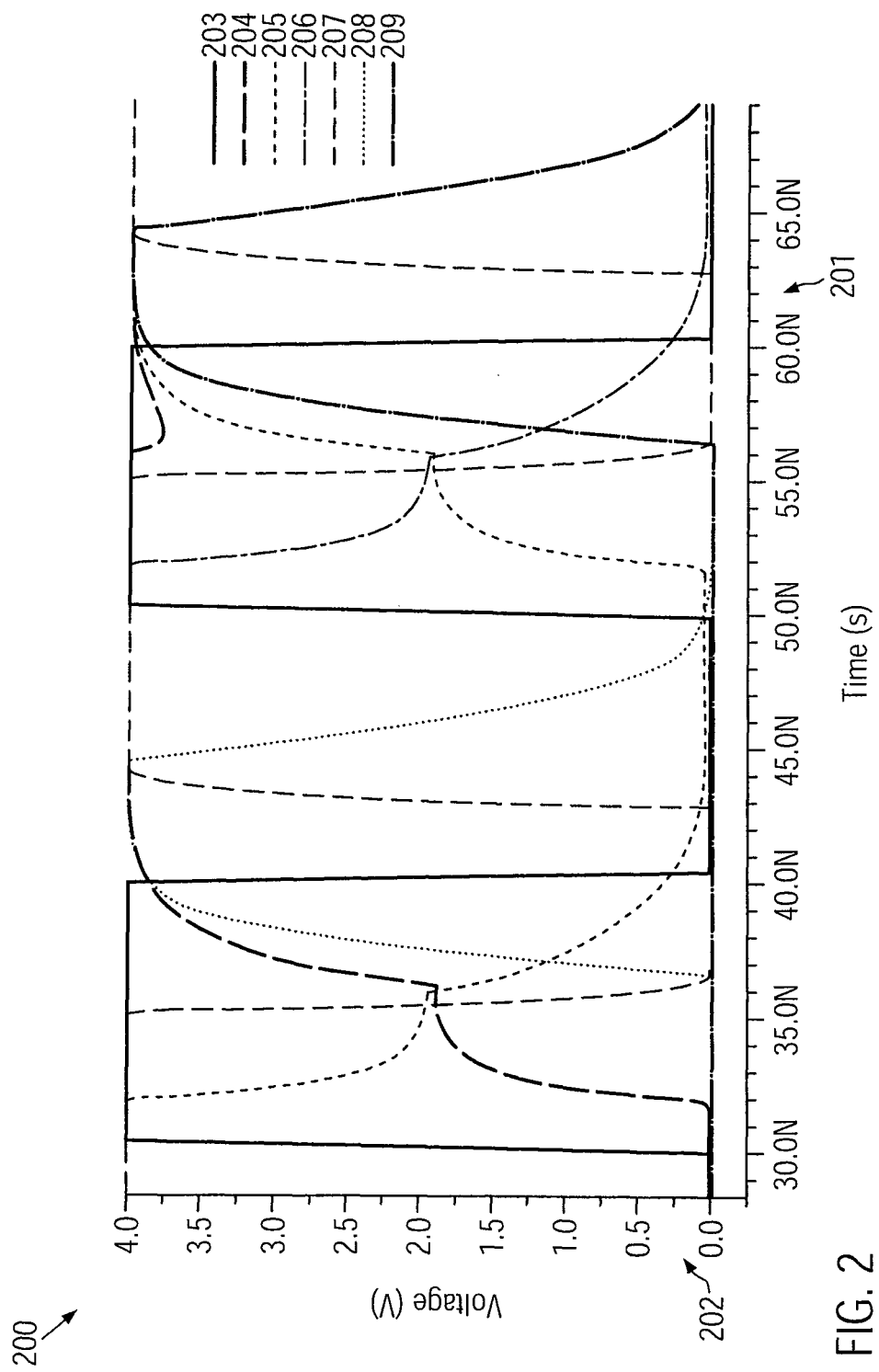
FIG. 2 shows curves of voltages occurring in the operation of the memory device shown in FIG. 1.

FIG. 2 shows a plot 200 of voltages occurring in the memory device 100 while data is written to the memory cell 106, and while data is written to a memory cell in a different column of the matrix 103, as will be described in more detail below. A horizontal coordinate axis 201 denotes time, and a vertical coordinate axis 202 denotes voltage, wherein the bitline write voltage is approximately zero voltage, and the wordline voltage as well as the precharge voltage is approximately 4 V.

In FIG. 2, a curve 203 shows the clock signal provided by the clock circuit 134. The clock signal 203 switches from a low value (approximately 0 V) to a high value (approximately 4 V) at the beginning of each operating cycle of the memory device 100, and switches back to the low value during the operating cycle. Hence, the start of each operating cycle is indicated by a raising flank of the clock signal 203.

Upon receipt of the raising flank of the clock signal 203, the driver circuit 125 applies the bitline write signal to the bitline charge control circuit 118 via the first input 129. The bitline charge control circuit 118 then electrically connects the bitline 113 to the bitline connection line 116.

In FIG. 2, curve 204 shows the voltage of the bitline 112, and curve 205 shows the voltage of bitline 113. At the beginning of the operating cycle wherein data is written to memory cell 105, bitline 112 is still substantially at the bitline write voltage (approx. 0 V), and bitline 113 is at the precharge voltage (approx. 4 V). When the bitline charge control circuit 118 provides an electrical connection between the bitline 113 and the bitline connection line 116, electrical charge can flow between the bitline 113 and the bitline 112 that is still connected to the bitline connection line 116 through the bitline connection line 116, and charge sharing can occur between the bitlines 112, 113. Thereby, the voltage of bitline 112 increases and the voltage of bitline 113 decreases, until the voltages of bitlines 112, 113 are approximately equal to the average of their initial values (approximately ½ of the precharge voltage).

In FIG. 2, reference numeral 207 denotes a voltage applied to the second inputs 127, 128, 131, 132 of the bitline charge control circuits 117-120. A low value of this voltage corresponds to the charge recycling end signal. A high value of the voltage applied to the second inputs 127, 128, 131, 132 of the bitline charge control circuits 117-120 indicates a state wherein the charge recycling end signal is not applied.

A predetermined time after the raising flank of the clock signal 203, wherein the predetermined time can be approximately equal to the time required for charge sharing between the bitlines 112, 113, the driver circuit 125 applies the charge recycling end signal to the bitline charge control circuits 117-120. Since the bitline charge control circuit 117 does not receive the bitline write signal any more, upon receipt of the charge recycling end signal, the bitline charge control circuit 117 disconnects the bitline 112 from the bitline connection line 116, and applies the precharge signal to the precharge circuit 121, and the precharge circuit 121 applies the precharge voltage to the bitline 112. Thus, the bitline 112 is charged from approximately ½ of the precharge voltage to the precharge voltage.

Since the bitline charge control circuit 118 receives the bitline write signal from the driver circuit 125, the bitline 113 remains electrically connected to the bitline connection line 116 when the charge recycling end signal is applied. The driver circuit 125 connects the bitline connection line 116 to the bitline write voltage. Thus, the bitline 113 is discharged from about ½ of the precharge voltage to the bitline write voltage. Moreover, the driver circuit 125 applies the wordline voltage to the wordline 102, whose voltage is shown by curve 208 in FIG. 2. After applying the wordline voltage to the wordline 102, the voltage of the wordline 102 increases from approximately zero to the wordline voltage.

The memory cell 106, with the bitline write voltage applied via the bitline 113, the precharge voltage applied via the bitline 112, and the wordline voltage applied via the wordline 102 turns into a state wherein the data bit to be written into the memory cell 106 is stored in the memory cell 106. Thus, the writing of data to the memory cell 106 is completed.

Thereafter, the application of the charge recycling end signal to the bitline charge control circuits 117-120 is terminated, as indicated by a raise of the voltage 207 applied to the second inputs of the bitline charge control circuits 117-120, and the application of the wordline voltage to the wordline 102 is also terminated, as indicated by the decrease of the voltage 208 of the wordline 102.

Since charge sharing between the bitline 112 and the bitline 113 occurs before the precharge voltage is applied to the bitline 112 and the bitline write voltage is applied to the bitline 113, only about one half of the electric power that would be required for charging the bitline 112 from the bitline write voltage to the precharge voltage and for discharging the bitline 113 from the precharge voltage to the bitline write voltage is required in the memory device 100 for obtaining the bitline write voltage at the bitline 113 and for obtaining the precharge voltage at the bitline 113.

In the memory device 100, charge sharing can not only be performed between bitlines in the same column of the matrix 103 of memory cells. In FIG. 2, curve 206 shows a voltage of a bitline connected to a memory cell that is located in another column of the matrix 103, for example bitline 114 connected to memory cell 105 in column 111, and curve 209 shows a voltage of the wordline 101 connected to the memory cell 105.

After writing data to the memory cell 106 as described above, at the next raising flank of the clock signal 203, the bitline 114 can electrically connected to the bitline 113 by connecting both the bitline 114 and the bitline 113 to the bitline connection line 116. A predetermined time after electrically connecting the bitlines 114, 113 with each other, the charge recycling end signal is received, as indicated by a falling flank of the voltage 207 applied to the second input ports 128, 128 131, 132 of the bitline charge control circuits, the bitlines 113, 114 are electrically disconnected from each other by electrically disconnecting the bitline 113 from the bitline connection line 116, the bitline write voltage is applied to the bitline 114 by electrically connecting the bitline connection line 116 to a bitline write voltage supply, for example by applying ground potential to the bitline connection line 116, the precharge voltage is applied to the bitline 113 and the wordline voltage is applied to the wordline 102. These steps can be performed in a manner corresponding to that described above for the writing of data to memory cells 104, 106 described above.

In addition to the components described above with reference to FIG. 1, the memory device 100 can comprise known read circuitry for reading data from the memory cells 104-107 of the matrix 103 of memory cells. The read circuitry can correspond to data read circuitry of conventional memory, and the data read operation can be performed in a similar manner as in conventional memory devices, wherein the wordline voltage is applied to a wordline connected to the memory cell to be read, and the voltage difference between the two bitlines connected to the memory cell to be read is evaluated by means of a sense amplifier. After the read operation, the bitlines can be charged to the precharge voltage again. In embodiments wherein the memory cells are dynamic memory cells, and each memory cell is connected only to a single bitline, known methods for reading the contents of dynamic memory cells can be employed.

The memory device 100 can further comprise one or more known multiplexing circuits, wherein the memory cells 104-107 that are connectable to the bitline connection line 116 are connected to the same multiplexing circuit. In addition thereto, the memory device can comprise memory cells connected to other multiplexing circuits, and connectable to one of a plurality of bitline connection lines other than the bitline connection line 116. Thus, the above-described charge equilibration process can be performed between the bitlines of memory cells connected to the same multiplexing circuit.

As described above, in embodiments of the present disclosure, when data is written to any one of the memory cells 104-107, the wordline voltage can be applied to the wordline connected to the respective memory cell after the charge sharing between the bitline used for writing data to the memory cell and the bitline used in a preceding write operation. Compared to other embodiments, wherein the wordline voltage is applied upon the raising flank of the clock signal, this allows reducing the pulse width of the wordline voltage, leading to a further reduction of the power consumption of the memory device in addition to that provided by the charge sharing between the bitlines.

Figure 3:
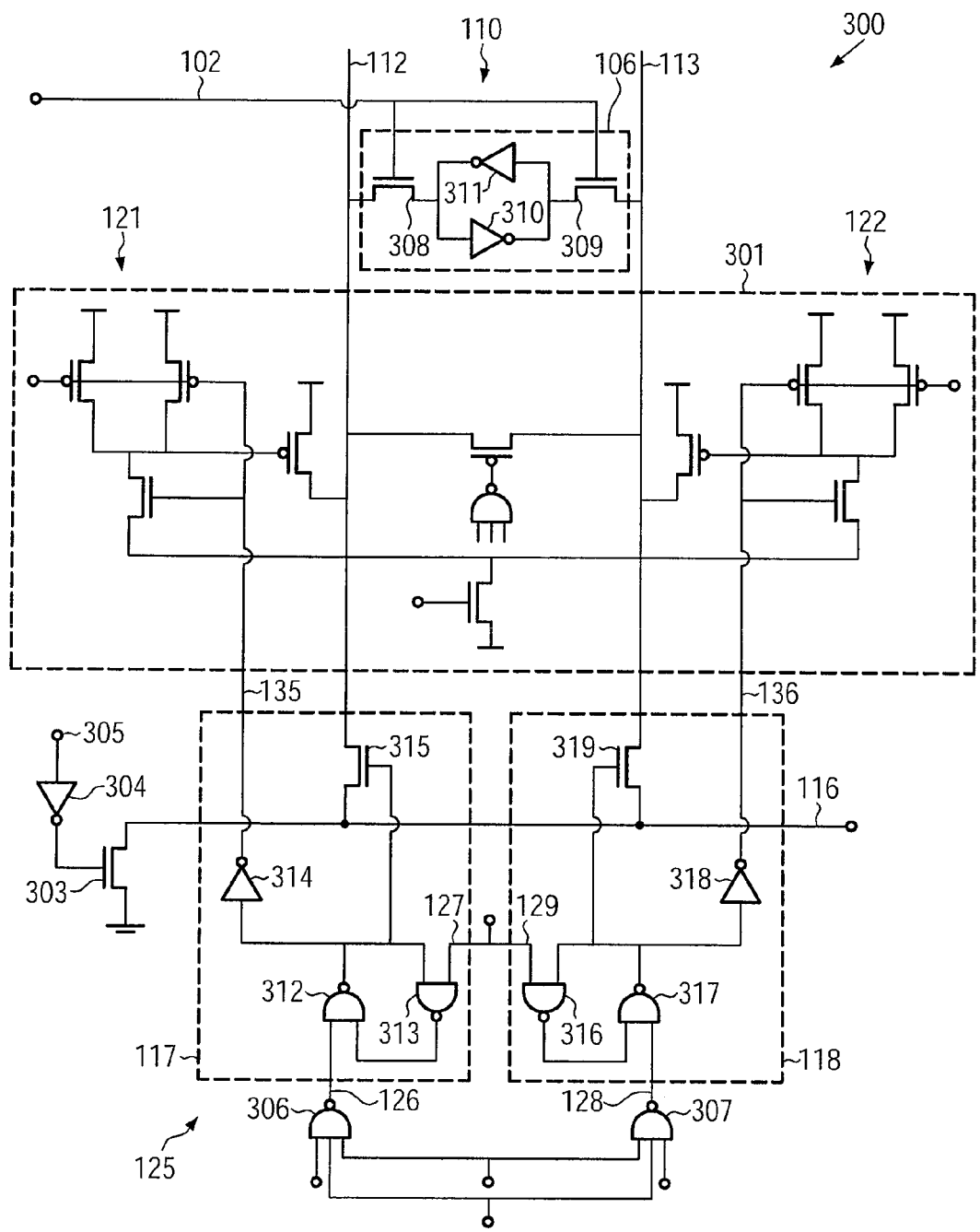
FIG. 3 shows a simplified circuit diagram of the memory device shown in FIG. 1.

FIG. 3 shows a schematic circuit diagram of portions of the memory device 100. For convenience, in FIGS. 1 and 3, like reference numerals have been used to denote like components. In FIG. 3, only column 110 of the matrix 103 of memory cells is shown. Column 111, and precharge circuits 123, 124 as well as bitline charge circuits 119, 120 associated with bitlines 114, 115 of column 111 have been omitted. Moreover, memory cell 104, wordline 101 and portions of the driver circuit 125 have been omitted for simplicity.

The features of column 111, precharge circuits 123, 124 and bitline charge circuits 119, 120 can be substantially identical to those of corresponding components in column 110. Moreover, all the memory cells in the matrix 103 of memory cells can have substantially the same structure as memory cell 106.

Memory cell 106 comprises a first inverter 310 and a second inverter 311. An output of the first inverter 310 is connected to an input of the second inverter 311. The memory cell 106 further comprises a transistor 308 connected between the input of the first inverter 310 and bitline 112, and a transistor 309 connected between the input of the second inverter 311 and bitline 113. The gates of transistors 308, 309 are connected to wordline 102.

The inverters 310, 311 form a bistable circuit that has two possible states: a first state, wherein the output of inverter 310 is on and the output of inverter 311 is off, and a second state, wherein the output of inverter 311 is on and the output of inverter 310 is off. Hence, the memory cell 106 can store one bit of information. If the wordline voltage is applied to wordline 102, transistors 308, 309 connect the memory cell 106 to bitlines 112, 113 for reading data from memory cell 106 and for writing data to memory cell 106, as described above. If the wordline voltage is not applied to wordline 102, the transistors 308, 309 are in a nonconductive state, separating the inverters 310, 311 of memory cell 106 from bitlines 112, 113.

The bitline charge control circuit 117 comprises a first NAND circuit 312 and a second NAND circuit 313. An output of the second NAND circuit 313 is connected to one of the inputs of the first NAND circuit 312. The other input of the first NAND circuit 312 forms the first input 126 of the bitline charge control circuit 117, and is connected to the driver circuit 125. The driver circuit applies an off signal that can correspond to a low voltage value to the first input 126 if the bitline write signal is applied to the bitline charge control circuit 117, and applies an on signal that can correspond to a high voltage value if the bitline write signal is not applied to the bitline charge control circuit 117.

The driver circuit 125 can comprise a NAND circuit 306, the output of which is applied to the first input 126. The NAND circuit 306 has three inputs.

One of the inputs of the second NAND circuit 313 is connected to the output of the first NAND circuit 312. The other input of the second NAND circuit 313 provides the second input 127 of the bitline charge control circuit 117. It receives an off (for example, a low) signal if the charge recycling end signal is applied to the bitline charge control circuit 117 and an on (for example, a high) signal otherwise.

The output of the first NAND circuit 312 is connected to a transistor 315 connected between the bitline 112 and the bitline connection line 116. If the output of the first NAND circuit 312 is on, the transistor 315 provides an electrical connection between the bitline 112 and the bitline connection line 116. If the output of the first NAND circuit 312 is off, the bitline 112 is disconnected from the bitline connection line.

Each of the NAND circuits 312, 313 outputs an off signal, if both inputs of the respective NAND circuit 312, 313 receive an on signal, and provides an on signal otherwise.

If the first input 126 of the bitline precharge circuit 117 receives an off signal and the second input 127 of the bitline precharge circuit 117 receives an on signal, corresponding to a state wherein the bitline write signal is applied to the bitline precharge circuit 117 and the charge recycling end signal is not applied to the bitline precharge circuit 117, the output of the first NAND circuit is on, and the bitline precharge circuit 117 provides an electrical connection between the bitline 112 and the bitline connection line 116. If, starting from this state, the first input 126 is switched to on, i.e., when the bitline write signal is no longer applied to the bitline precharge circuit 117, the output of the first NAND circuit 312 remains on, as long as the input 127 receives an on signal, i.e., as long as the charge recycling end signal is not applied to the input 127. Thus, the bitline charge control circuit 117 maintains the electrical connection between the bitline 112 and the bitline connection line 116 when the driver circuit ceases 125 to apply the bitline write signal to the bitline charge control circuit 117.

If, in the above-described state wherein the first input 126 and the second input 127 receive an on signal and the output of the first NAND circuit 312 is in the on state, the second input 127 is switched to off, i.e., if the charge recycling end signal is applied to the bitline charge control circuit 117, the output of the first NAND circuit 312 switches to off and the transistor 315 electrically disconnects the bitline 112 from the bitline connection line 116. Hence, when bitline charge control circuit 117 receives the charge recycling end signal and the bitline write signal is not applied to first input 126 of the bitline charge control circuit 117, the bitline charge control circuit 117 electrically disconnects the bitline 112 from the bitline connection line 116.

If the first input 126 and the second input 127 of the bitline charge control circuit 117 receive an on signal, the output of the first NAND circuit 312 is off, and the first input 126 is switched from on to off, i.e., if the bitline write signal is applied to the bitline charge control circuit 117 and the charge recycling end signal is not applied to the bitline charge control circuit 117, the output of the first NAND circuit switches from off to on.

If the second input 127 of the bitline charge control circuit 117 receives an off signal, i.e., if the charge recycling end signal is applied to the bitline charge control circuit 117, the output of the first NAND circuit 312 is inverse to the first input 126. Hence, upon receipt of the bitline write signal, the bitline charge control circuit provides an electrical connection between the bitline 112 and the bitline connection line 116, and electrically disconnects the bitline 112 from the bitline connection line 116 otherwise.

The bitline charge control circuit 117 can further comprise an inverter 314. An input of the inverter is connected to the output of the first NAND circuit 312. The output of the inverter 314 provides the precharge signal, and is connected to the precharge circuit 121.

The memory device 100 comprises electrical circuitry 301 providing the precharge circuits 121, 122. The precharge circuit 121 electrically connects the bitline 112 to the precharge voltage if the precharge signal received from the bitline charge control circuit is on, and electrically disconnects the bitline 112 from the precharge voltage if the precharge signal received from the bitline charge control circuit 117 is off.

Similar to the bitline charge control circuit 117, the bitline precharge control circuit 118 comprises NAND circuits 316, 317, a transistor 319 and an inverter 318. The connection and function of these elements correspond to those of corresponding elements in the bitline charge control circuit 117. The driver circuit 125 can comprise a NAND circuit 307 whose output is connected to the first input of the bitline charge control circuit 118.

The driver circuit 125 further comprises an inverter 304. An input 305 of the inverter 304 receives substantially the same signal as the second inputs of the bitline charge control circuits 117, 118, i.e., off if the charge control signal is applied and on otherwise. The output of the inverter 304 is connected to the gate of a transistor 303 connected between the bitline connection line 116 and ground, wherein ground provides the bitline write voltage, as described above. The transistor 303 electrically connects the bitline connection line 116 to ground, if the output of the inverter 304 is on, and electrically disconnects the bitline connection line 116 from ground if the output of the inverter 304 is off. Thus, the driver circuit 125 applies the bitline write voltage to the bitline connection line 116 substantially simultaneously to applying the charge recycling end signal to the bitline charge control circuits 117-120.

Figure 4:
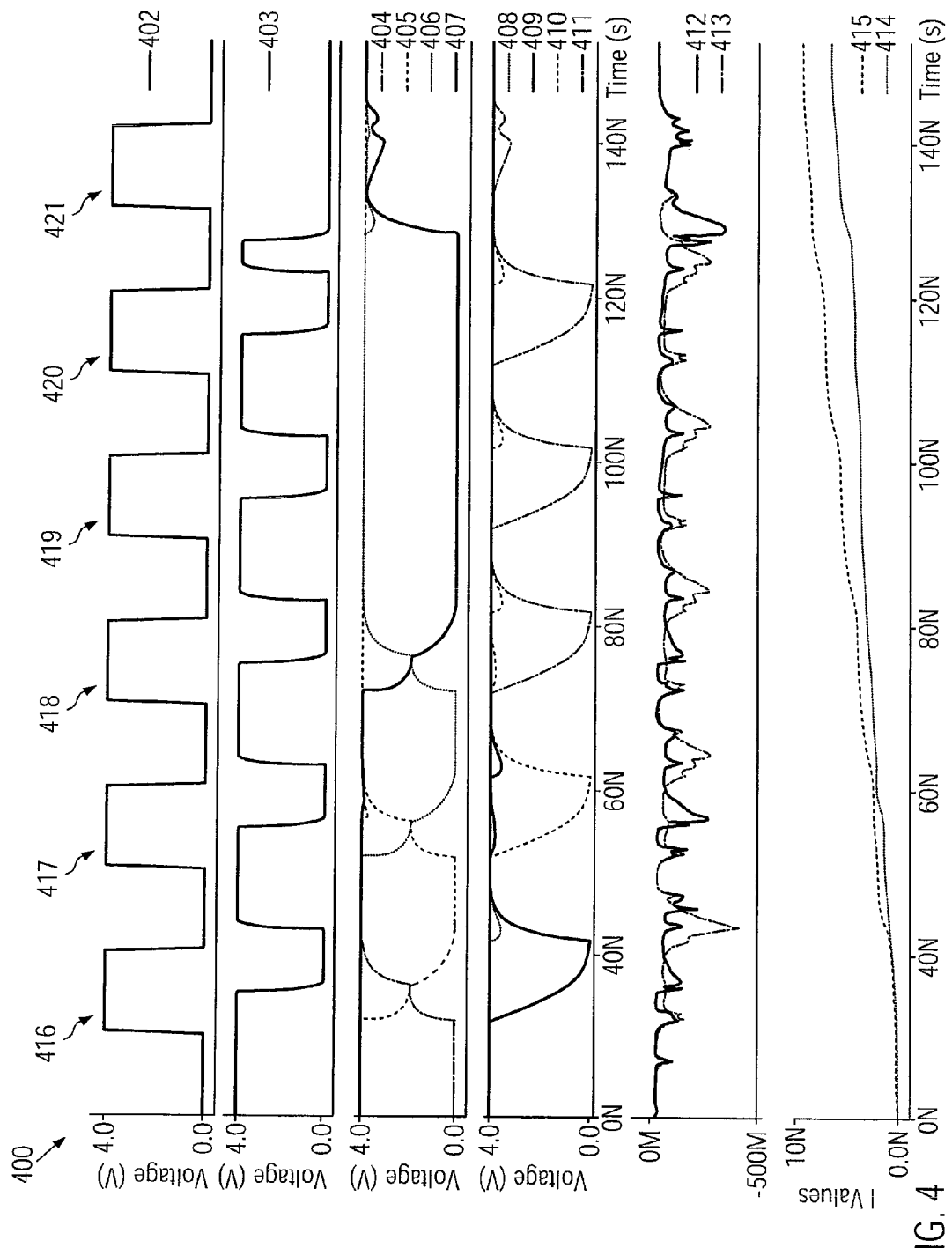
FIG. 4 shows simulation results illustrating a comparison between the memory device shown in FIG. 1 and a conventional memory device.

FIG. 4 shows a diagram 400 showing simulation results illustrating a comparison between the memory circuit 100 described above and a memory circuit according to the state of the art. In the diagram 400, curve 402 shows the clock signal provided by the clock circuit 134. Each of pulses 416 to 421 of the clock signal 402 corresponds to one operating cycle of the memory device 100. Curve 403 shows the voltage applied to the second inputs of the bitline charge control circuits 117-120, which is low (off) if the charge recycling end signal is applied to the bitline charge control circuits 117-120, and high (on) otherwise. Between clock pulses 420 and 421, the memory device 100 is switched into a debug mode wherein the charge recycling end signal is permanently applied to the bitline charge control circuits 117-120. Thus, the output of the bitline charge control circuits 117-120 is always inverse to the input received from the driver circuit 125, and the bitline charge control circuits 117-120 connect the bitlines 112-115 to the bitline connection line if and only if the bitline write signal is applied to the respective bitline charge control circuit. In the debug mode, the bitline connection line 116 is always connected to the bitline write voltage. In some embodiments, the driver circuit 125 can comprise suitable circuitry for providing the debug mode.

Curves 404-407 show the voltages of four different bitlines in the memory circuit 100. The curves 404, 405 show the voltages of the two bitlines in a first column of the matrix 103 of memory cells, and the curves 406, 407 show the voltages of the two bitlines in a second column of the matrix 103 of memory cells. Curves 408, 409 show the voltages of two bitlines in a first column of a matrix of memory cells in a conventional memory device, and curves 410, 411 show the voltages of two bitlines in a second column of the matrix of memory cells in the conventional memory device. Curves 412 and 413, respectively, show current flow in the memory device 100 and in the conventional memory device, respectively, and curves 414 and 415 show the time integral of current flow in the memory device 100 and in the conventional memory device, respectively.

If the memory device 100 is not in the debug mode, the current flow in the memory device 100 is lower than in the conventional memory device, corresponding to a lower power consumption of the memory device 100. During clock pulses 419, 420 the same bit value is written to memory cells in the same column of the matrix of memory cells. In this case, a particularly small current flow can be obtained in the memory device 100, since the voltage of all the bitlines remains substantially constant. To the contrary, in the conventional memory device, the voltage of one of the bitlines changes at each clock pulse, leading to higher power consumption.

In the debug mode, which is applied during clock pulse 421, the power consumption of the memory device 100 is substantially equal to that of the conventional memory device.

In the following, the reduction of the power consumption that can be obtained in a static random access (SRAM) memory device according to the present disclosure will be explained in more detail. The cut power of an SRAM device can be separated in two parts: The first part (approx. 30% to 40% of the cut power) is required for control circuitry such as the driver circuit 125, row decoder circuitry and sense amplifiers. The second part (approx. 60% to 70% of the cut power) is required for precharging the bitlines. During a write operation, selected column bitline full swing precharge power is approx. 45 to 55%, and the non-accessed column's precharge power (being similar to the power required for a read operation in the non accessed columns) is approximately 45 to 55%. If we consider it to be approx. 50%, in the memory device 100 approx. 50% of the selected column bitline full swing precharge power is saved, which will be approx. 50/2=25% of the bitline precharge power in the cut, which will be 70/100*25=17.35% of the cut power. If dual wordline is also implemented, this will make a full swing bitline and non accessed columns ratio approx. 80% to 20%, which will be approx. 80/2*70/100=28% of the cut power.

The area penalty for providing a memory circuit as described above, compared to a conventional memory device, can be less than 3%, and approx. 50% of the bitline full swing power can be saved during write operation.

The memory device 100 and the method of operation thereof can be applied for reducing bitline precharge power consumption by approx. 50% in static memory devices, dynamic memory devices and other types of memories.

In some embodiments, the charge recycling pulse generation can be realized inside the memory device 100, or, in other embodiments, an external dedicated pin can be used for its generation.

In some embodiments, boost circuits can be used to boost the charge sharing in less time to save timings penalty.

In some embodiments, a debug mode can be used, as described above, to switch the memory operation between a debug mode, corresponding to the operation of a conventional memory device, and the charge sharing mode. Thus, as required, speed of the memory device or power consumption can be prioritized.

The method and memory device according to the present disclosure can save more power for certain bitmap writing trend of the memory. For example, a continuous write in the same column will further reduce power consumption, depending on the data to be written into the memory cells.

The method can be calibrated for maximum power gain throughout the compiler range. For a cut range having less power saving (e.g., with smaller number of row cuts), the memory device can be operated in the debug mode to save timings penalty.

In some embodiments, self time tracking can be designed for charge sharing and setting of lines before memory operation starts, by means of a circuit in a control block.

In some embodiments, NOR circuits can be used instead of the NAND circuits 312, 313, 316, 317, the polarity and connections should be modified accordingly.

In some embodiments, pass gates can be used for charge sharing instead of only PMOS or NMOS transistors. A final driver can be one pass transistor device and another device that is activated during sharing mode.

In some embodiments, the charge recycling end signal can be created externally to memory device 100. In other embodiments, the charge recycling end signal can be generated internally to the memory device 100 using fixed inverter delays. In still further embodiments, the charge recycling end signal can be generated internally to the memory device by tracking the Dummy line discharge.

While the terms "couple" or "coupled" and "connect" or "connected" are used herein, both in the specification and the claims, none of these terms should be construed as requiring a direct connection with no intervening components. The use of the terms "couple", "coupled", "connect", and "connected" allow for indirect connections therebetween, with intervening components such as resistors, capacitors, transistors, inverters, logic gates, or the like as would be contemplated by a person of ordinary skill in the art.

Although one or more embodiments of the present invention have been described for purposes of illustration, it should be understood that various changes, modification and substitutions may be incorporated in the embodiment without departing from the spirit of the invention that is defined in the claims, which follow.

The invention claimed is:

1. A method of writing data to a memory device comprising a plurality of bitlines, a plurality of wordlines, and a matrix of memory cells, said matrix of memory cells comprising a plurality of memory cells arranged in a plurality of rows and columns, each of said bitlines being electrically coupled to memory cells in one of said columns, each of said wordlines being electrically coupled to memory cells in one of said rows, said method comprising:
   applying a bitline write voltage to a first bitline;
   applying a wordline voltage to a first wordline for writing data to a first memory cell coupled to said first wordline and said first bitline;
   electrically coupling said first bitline and a second bitline for charge sharing between said first bitline and said second bitline;
   electrically disconnecting said first and said second bitline and applying said bitline write voltage to said second bitline; and
   applying said wordline voltage to a second wordline for writing data to a second memory cell coupled to said second wordline and said second bitline.

2. A method as in claim 1, wherein said memory device comprise a bitline connection line, and wherein applying said bitline write voltage to said first bitline comprises electrically coupling said first bitline to said bitline connection line and coupling said bitline connection line to a bitline write voltage supply.

3. A method as in claim 2, wherein said bitline write voltage supply comprises an electrical connection to ground.

4. A method as in claim 2, wherein electrically coupling said first bitline and said second bitline for charge sharing between said first bitline and said second bitline comprises coupling said first and said second bitline to said bitline connection line and disconnecting said bitline connection line from said bitline write voltage supply.

5. A method as in claim 4, wherein electrically disconnecting said first and said second bitline and applying said bitline write voltage to said second bitline comprises disconnecting said first bitline from said bitline connection line and coupling said bitline connection line to said bitline write voltage supply.

6. A method as in claim 1, further comprising:
after electrically disconnecting said first bitline and said second bitline, applying a precharge voltage to said first bitline.

7. A method as in claim 1, wherein said applying said wordline voltage to said second wordline, said electrically disconnecting said first bitline and said second bitline, and said applying said bitline write voltage to said second bitline are performed substantially simultaneously.

8. A method as in claim 1, wherein each of said memory cells is a static memory cell electrically coupled to two of said bitlines.

9. A method as in claim 8, wherein said first and said second memory cell are in a same column of said matrix of memory cells, and said first memory cell and said second memory cell are electrically coupled to said first and said second bitline.

10. A method as in claim 8, wherein said first and said second memory cell are in different columns of said matrix of memory cells, wherein said first memory cell is electrically coupled to said first bitline but not to said second bitline, and wherein said second memory cell is electrically coupled to said second bitline but not to said first bitline.

11. A memory device, comprising:
a plurality of wordlines;
a plurality of bitlines;
a matrix of memory cells, said matrix of memory cells comprising a plurality of memory cells arranged in a plurality of rows and columns, each of said bitlines being electrically coupled to memory cells in one of said columns, each of said wordlines being electrically coupled to memory cells in one of said rows; and
a bitline connection line,
wherein each of said columns comprises:
a bitline charge control circuit; and
a precharge circuit for applying a precharge voltage to one of said bitlines associated with said column upon receipt of a precharge signal from said bitline charge control circuit,
wherein said bitline charge control circuit is adapted for electrically coupling said one of said bitlines to said bitline connection line upon receipt of a bitline write signal, for maintaining the electrical connection between said one of said bitlines and said bitline connection line when said bitline write signal is not received any more, and for electrically disconnecting said one of said bitlines and said bitline connection line and supplying said precharge signal to said precharge circuit when a charge recycling end signal is received and said bitline write signal is not received.

12. A memory device as in claim 11, wherein said memory device further comprises:
a driver circuit for applying said bitline write signal to one of said bitline charge control circuits coupled to one of said bitlines coupled to a memory cell to be written and, applying said charge recycling end signal to each of said bitline charge control circuits, applying a bitline write voltage to said bitline connection line, and applying a wordline voltage to a wordline associated with a row of said matrix of memory cells wherein the memory cell to be written is located and subsequently ceasing to apply said bitline write signal.

13. A memory device as in claim 12, wherein said driver circuit comprises an inverter, an input of said inverter receiving an off signal if the charge recycling end signal is applied and an on signal otherwise, wherein the output of the inverter is applied to a transistor coupled between said bitline connection line and a bitline write voltage supply for electrically coupling said bitline connection line to said bitline write voltage supply if said charge recycling end signal is applied and for holding said bitline connection line electrically floating otherwise.

14. A memory device as in claim 12, wherein each of said first bitline and said second bitline is coupled to a respective bitline charge control circuit, wherein said driver circuit is adapted for applying said bitline write signal to one of said bitline charge control circuits and for applying said wordline voltage to said wordline for writing a first bit value to said memory cell.

15. A memory device as in claim 14, wherein said driver circuit is adapted for applying said bitline write signal to the other of said bitline charge control circuits and for applying said wordline voltage to said wordline for writing a second bit value to said memory cell.

16. A memory device as in claim 12, further comprising a clock circuit providing a clock signal, wherein said driver circuit is adapted for applying said bitline write signal to said one of said bitline charge control circuits at a rising edge of said clock signal, and for applying said charge recycling end signal after said rising edge of said clock signal.

17. A memory device as in claim 16, further comprising a connection pin for coupling said memory device to an external circuit adapted for providing said charge recycling end signal, said driver circuit comprising one or more electrically conductive lines electrically coupling said connection pin to each of said bitline control circuits for applying said charge recycling end signal to each of said bitline charge control circuits.

18. A memory device as in claim 16, wherein said driver circuit comprises a delay circuit, an input of said delay circuit receiving said clock signal, an output of said delay circuit being applied to each of said bitline charge control circuits as said charge recycling end signal.

19. A memory device as in claim 11, wherein said bitline charge control circuit comprises:
a first and a second NAND circuit, each of said first and second NAND circuits comprising two inputs and two outputs.

20. A memory device as in claim 19, wherein the output of the second NAND circuit is coupled to one of the inputs of the first NAND circuit, the other input of the first NAND circuit receiving an off signal if the bitline write signal is applied to the bitline charge control circuit and an on signal otherwise.

21. A memory device as in claim 20, wherein one of the inputs of the second NAND circuit is coupled to the output of the first NAND circuit and the other input of the second NAND circuit receives an off signal if the charge recycling end signal is applied to the bitline charge control circuit and an on signal otherwise.

22. A memory device as in claim 21 wherein the output of the first NAND circuit is coupled to a transistor coupled between said one of said bitlines and said bitline connection line for electrically coupling said one of said bitlines to said bitline connection line if the output of the first NAND circuit is on and for electrically disconnecting said one of said bitlines from said bitline connection line if the output of the first NAND circuit is off.

23. A memory device according to claim 11, wherein said bitline control circuit further comprises:
- an inverter having an input and an output, the input of the inverter being coupled to the output of the first NAND circuit, the output of the inverter providing said precharge signal, wherein said precharge circuit is adapted to apply said precharge voltage to said one of said bitlines only if said precharge signal is on.

24. A memory device as in claim 11, wherein each of said plurality of memory cells comprises:
- a first inverter and a second inverter, an output of said first inverter being coupled to an input of said second inverter, an output of said second inverter being coupled to and input of said first inverter;
- a first transistor coupled between an input of said first inverter and a first bitline associated with a column of said matrix of memory cells wherein said memory cell is located; and
- a second transistor coupled between an input of said second inverter and a second bitline associated with said column.

25. A memory device as in claim 24, wherein a gate electrode of said first transistor and a gate electrode of said second transistor are coupled to a wordline associated with a row of said matrix of memory cells wherein said memory cell is located.

26. A memory device as in claim 11, further comprising a multiplexer for alternatively coupling each of said columns of said matrix of memory cells to a common data line.

27. A memory device as in claim 11, comprising a debug mode wherein said driver circuit permanently applies said charge recycling end signal to each of said bitline charge control circuits.

28. A memory device, comprising:
- a plurality of bitlines;
- a plurality of wordlines;
- a matrix of memory cells, said matrix of memory cells comprising a plurality of memory cells arranged in a plurality of rows and columns, each of said bitlines being electrically coupled to memory cells in one of said columns, each of said wordlines being electrically coupled to memory cells in one of said rows; and
- circuitry configured for:
  - applying a bitline write voltage to a first bitline;
  - applying a wordline voltage to a first wordline for writing data to a first memory cell coupled to said first wordline and said first bitline;
  - electrically coupling said first bitline and a second bitline for charge sharing between said first bitline and said second bitline;
  - electrically disconnecting said first bitline and said second bitline and applying said bitline write voltage to said second bitline after electrically coupling the first bitline and the second bitline; and
  - applying the wordline voltage to a second wordline for writing data to a second memory cell coupled to the second wordline and the second bitline.

* * * * *